(12) United States Patent
Lofland et al.

(10) Patent No.: US 6,625,021 B1
(45) Date of Patent: Sep. 23, 2003

(54) HEAT SINK WITH HEAT PIPES AND FAN

(75) Inventors: Steven J. Lofland, Portland, OR (US); Jason B. Chesser, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/200,630

(22) Filed: Jul. 22, 2002

(51) Int. Cl.[7] .................................................. H05K 7/20
(52) U.S. Cl. ................. 361/697; 165/80.3; 165/104.33; 165/121; 174/15.2; 257/714; 257/722; 257/719; 361/700; 361/720
(58) Field of Search ........................ 165/80.3, 121–126, 165/104.33, 185; 174/15.2; 257/714–716, 722, 718–719; 361/700–701, 694–697, 704, 707, 709–710, 719–720

(56) References Cited

U.S. PATENT DOCUMENTS 5,583,746 A * 12/1996 Wang ........................ 361/697
5,959,837 A * 9/1999 Yu ............................. 361/697
6,542,364 B2 * 4/2003 Lai et al. .................... 361/697

\* cited by examiner

Primary Examiner—Gregory Thompson
(74) Attorney, Agent, or Firm—Carrie A. Boone, P.C.

(57) ABSTRACT

A heat sink provides efficient heat transfer from a heat-producing semiconductor device. Heat pipes project from a spreader plate in contact with the device and distribute heat to multiple cooling fins. The fins are arranged for maximum contact with the ambient air. An active fan is internally disposed within the fins, for further cooling efficiency. The heat sink may be permanently affixed to a printed circuit board holding the semiconductor device or the heat sink may be attached and released thereto without need of tools. A base plate maintains spring-like compliance of the printed circuit board while allowing sufficient clamping force on the heat sink to sustain thermal contact with the heat-producing surface during shock-loading.

21 Claims, 6 Drawing Sheets

HEAT SINK WITH HEAT PIPES AND FAN

FIELD OF THE INVENTION

This invention relates to heat sinks and, more particularly, to heat sinks including fans and heat pipes.

BACKGROUND OF THE INVENTION

Semiconductors, including microprocessors and other integrated circuits (ICs), generate heat during use. Current microprocessors, for example, can emit 50 watts of power or more. The temperature of the microprocessor or IC has a direct impact upon its performance. Empirical studies have shown that the failure rate doubles for every 10° C. increase in the junction temperature (i.e., the temperature of a transistor within the IC).

Unless microprocessors and other ICs are thermally managed during use, they will not operate reliably. Failures include phenomena such as junction fatigue, electromigration diffusion, thermal runway, and electrical parameter shifts. For most uses of a semiconductor device, a proper mechanism for heat dissipation is needed.

Heat may be transferred from the device by convection, radiation, or conduction. Convection is the transfer of heat by moving air. Radiation is the transfer of heat from one surface to another via electromagnetic waves. Conduction is the transfer of heat between two solids, from a higher temperature object to a lower temperature one. Each of these principles may have a part in the operation of heat sinks.

Heat sinks are devices that attach directly to a semiconductor or other hot surface to enhance heat dissipation from the surface. Heat flows from the surface to cooler air through the heat sink. A heat sink is generally designed with a first surface, for engaging with the semiconductor, and a second surface, for contact with the cooler air. The second surface, often formed of a plurality of projections or fins, is designed for maximum surface area, and thus maximum contact with the air, to allow heat to dissipate more quickly.

To further facilitate air flow from the hot surface, many heat sinks include small fans mounted thereon. Heat pipes may also form part of the heat sink, allowing heat transfer to the liquid or gas within the pipes. The heat sink may be painted or anodized to enhance the effect of radiation heat transfer.

Another consideration when designing a heat sink is weight. Although copper-based heat sinks may be preferred over aluminum due to better heat transfer results, copper is a heavier material. A typical copper-based heat sink with a fan, for example, is over 500 grams in weight. A 450-gram heat sink has been shown to deflect a printed circuit board (PCB). The deflection of the PCB can cause component damage as well as damage to the PCB traces and solder pads.

Thus, there is a continuing need to support a heat-producing integrated circuit with a lightweight heat dissipating heat sink.

DETAILED DESCRIPTION

In accordance with the embodiments described herein, a heat sink is disclosed for providing efficient heat transfer from an integrated circuit (IC), such as a microprocessor, or other heat-producing semiconductor device. Heat pipes projecting from a spreader plate in contact with the semiconductor effectively distribute heat to multiple cooling fins, where the fins are arranged for substantial contact with the ambient air. An active fan is internally disposed within the fins, for further cooling efficiency.

The heat sink may be permanently affixed to a printed circuit board (PCB) that supports the semiconductor device or may be attached and released from the PCB without need of tools. A base plate maintains spring-like compliance of the PCB while allowing sufficient clamping force on the heat sink to sustain thermal contact with the heat-producing surface during shock-loading.

In the following detailed description, reference is made to the accompanying drawings, which show by way of illustration specific embodiments in which the invention may be practiced. However, it is to be understood that other embodiments will become apparent to those of ordinary skill in the art upon reading this disclosure. The following detailed description is, therefore, not to be construed in a limiting sense, as the scope of the present invention is defined by the claims.

Figure 1:
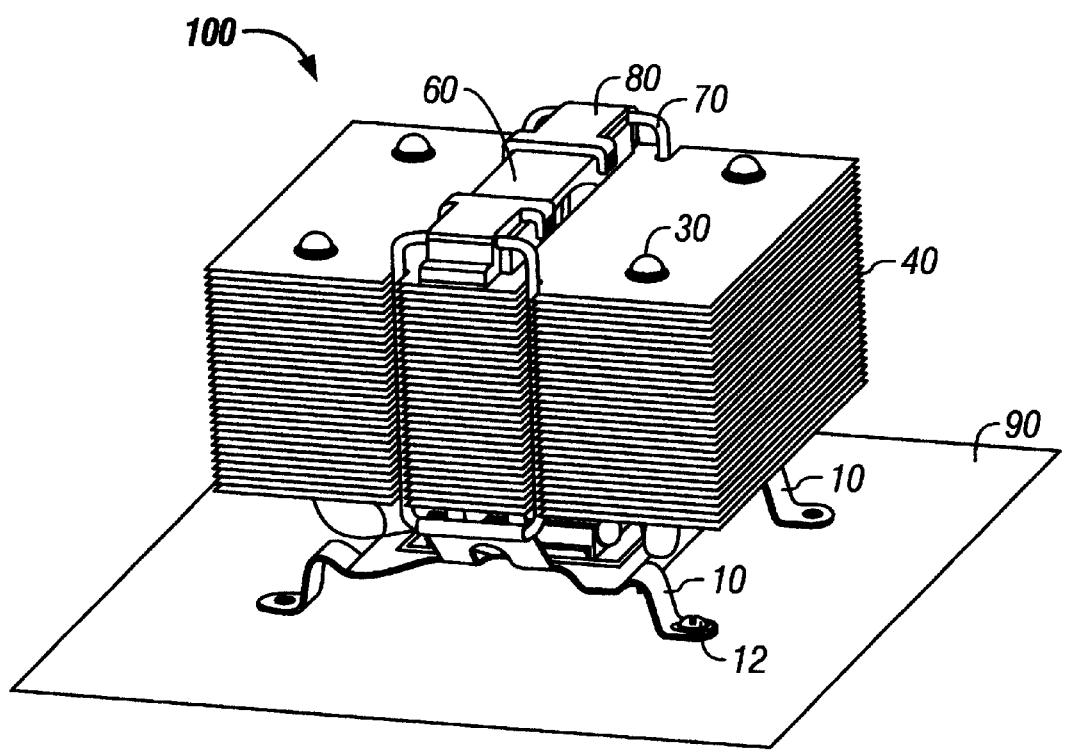
FIG. 1 is a perspective view of a heat sink including heat pipes, a fan, and a latch assembly according to one embodiment of the invention.
Figure 2:
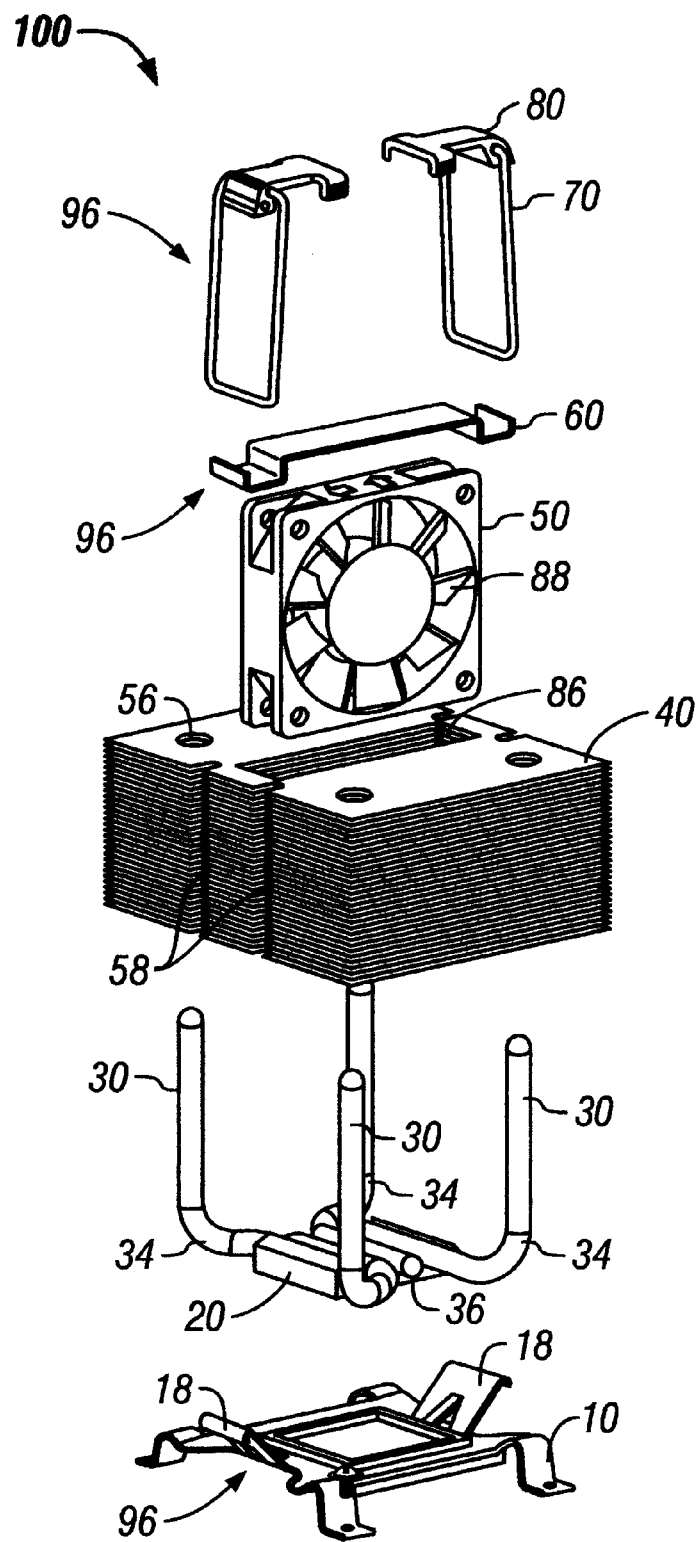
FIG. 2 is an exploded view of the heat sink of FIG. 1 according to one embodiment of the invention.

FIGS. 1 and 2 are perspective and exploded views, respectively, of a heat sink 100, according to one embodiment. The heat sink 100 includes a base plate 10, a spreader plate 20 coupled to heat pipes 30, cooling fins 40, and a fan 50. Optionally, the heat sink includes a latch assembly 96, including a fan cap 60, wire bails 70, a latch 80, and a projection 18, for holding the heat sink in an assembled relationship to a PCB 90, such as a motherboard or an add-in card.

In describing the heat sink, reference is made to the heat-producing device as an integrated circuit or other semiconductor device. Such devices include, but are not limited to, microprocessors, digital signal processors, gate arrays, custom chip designs, programmable logic devices, and the like.

Base Plate

The base plate 10 attaches the heat sink to the PCB 90 and provides alignment with a heat-producing semiconductor or other integrated circuit device (not shown). In one embodiment, the base plate is affixed to the PCB using one or more screws 12, as shown, such that when the PCB is populated with circuitry, the base plate is likewise securely coupled to the PCB. Once the heat-producing IC is affixed to the PCB, the base plate is disposed over and proximate to the IC, without substantial contact thereto. Once the base plate is in place, the one or more screws may be tightened, for affixation to the PCB. As an alternative, the base plate may be soldered or otherwise affixed to the PCB in a conventional manner familiar to system board designers of ordinary skill.

Figure 3A:
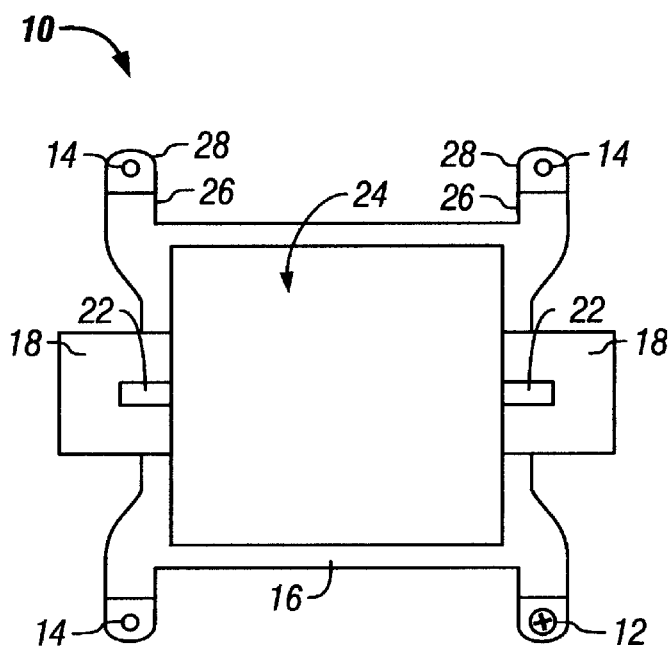
FIGS. 3A–3C are overhead and side views of the base plate for the heat sink of FIGS. 1 and 2 according to one embodiment of the invention.
Figure 3B:
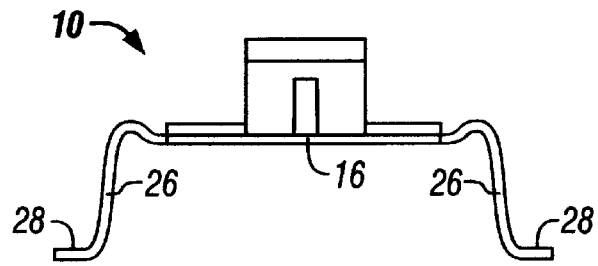
Figure 3C:
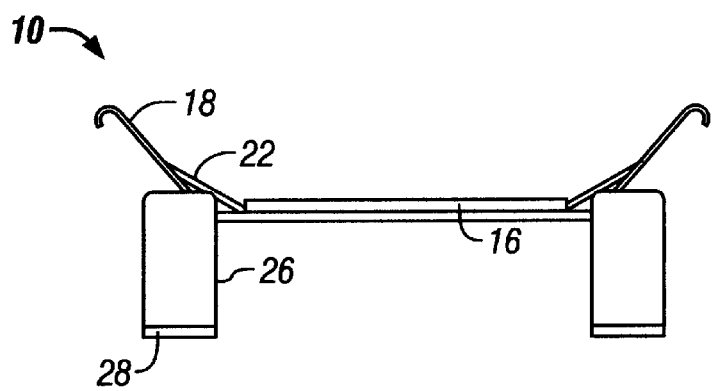

FIGS. 3A, 3B, and 3C are overhead, first side, and second side views, respectively, of the base plate 10 of FIGS. 1 and 2. In the overhead view, the base plate 10 includes a frame 16 defining an opening 24. The frame is shaped to surround but avoid contact with the heat-producing device, which is generally square or rectangular in shape. The cavity permits the spreader plate 20, positioned directly above the base plate, to make contact with the semiconductor while the base plate merely surrounds the same.

The base plate includes legs 26 and feet 28 including screw holes 14 for receiving the one or more screws 12. In the first side view (FIG. 3B), the legs 26, formed from sheets of lightweight material such as stainless steel, are curved in an arcuate shape, such that they may slightly bend and spring when a force is applied to the base plate. Such springing force may, for example, provide flexibility when the other heat sink components are connected to the base plate. Printed circuit boards are generally tolerant to some flexing. Thus, connected components that have some flexing capability are likely to operate more successfully for longer periods.

In the second side view (FIG. 3C), the projection 18 extends outward from the frame. Where the optional latch assembly 96 is used, the projection 18 receives the wire bail 70, extending from the bottom to the top of the heat sink assembly, so as to securely connect the heat sink components to the PCB-affixed base plate. Like the legs 26, the projection has some flexing capability, allowing the heat sink to be secured and disengaged without use of tools, for example. A strip 22 connected between the projection and the frame ensures that the projection extends in an upward direction, even though the projection curves in a downward direction at its end. The latch assembly 96 is described further in FIG. 7, below. Designers of ordinary skill in the art will recognize that the embodiments described for securing the heat sink to the semiconductor are illustrative only and are not meant to limit the scope of the invention.

Figure 4:
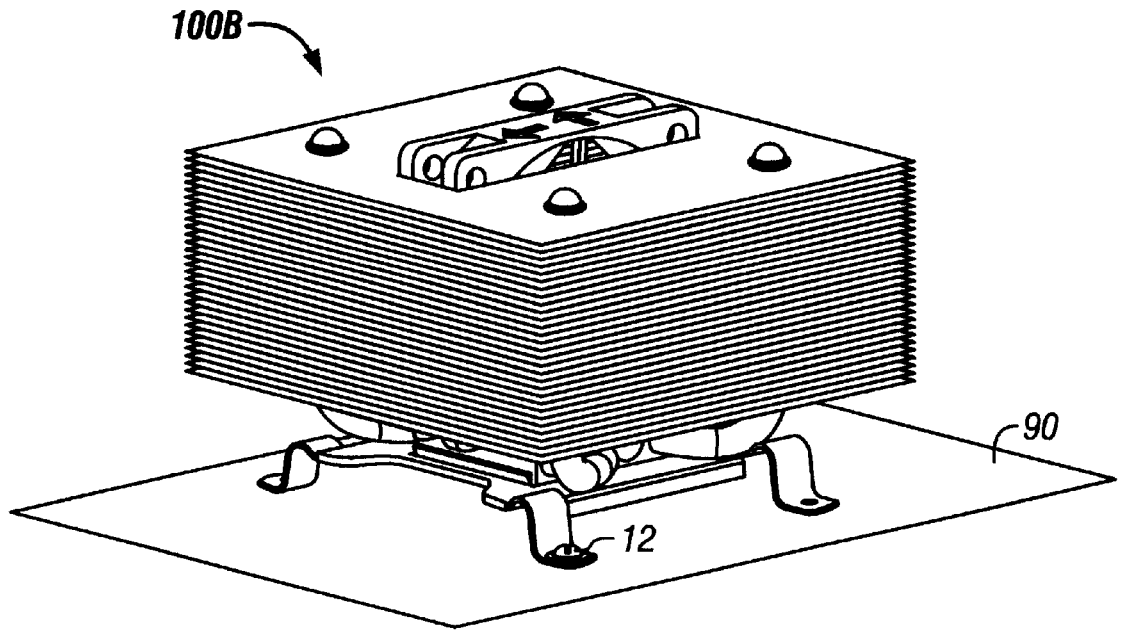
FIG. 4 is a perspective view of a heat sink with captivated components according to one embodiment of the invention.

FIG. 4 depicts an alternative heat sink assembly 100B, which includes no latch assembly. Instead, the base plate is captivated, for permanent connection to the spreader plate. Captivated connections can occur where extrusions in one connecting piece fit or snap into grooves of a receiving piece, for example. When captivated, the spreader plate 20 is fixed with the base plate such as to prevent radial and/or axial movement due to mechanical forces. The base and spreader plates of the heat sink 100B, stamped from sheets of stainless steel in one embodiment, are designed such that the spreader plate is captivated by the base plate upon installation. This allows the other heat sink components to be secured to the microprocessor or other semiconductor device without tools.

Spreader Plate and Heat Pipes

The spreader plate 20 fits into the opening 24 of the base plate 10 and sits atop the heat-producing device (not shown). A number of heat pipes 30 connect to respective heat pipe arms 34 of the spreader plate and extend upward. Heat from the device is conducted to the spreader plate, which operates as a thermal spreading block. The heat transfer continues through the heat pipes, which are connected to multiple cooling fins 40. In one embodiment, the spreader plate is kept small to minimize the overall weight of the heat sink assembly.

The exploded view of FIG. 1 shows four independent heat pipes attached to the spreader plate. Two heat pipes may be arranged in a "U" shape, instead of the four "L" shaped heat pipes shown, such as when a reduced part count for the heat pipe assembly is preferred.

Heat pipes are hermetically sealed chambers, inside of which is found a wicking structure and a working fluid. The heat pipe chamber itself is made of a highly conductive metal, such as copper. According to the principles of two-phase heat transfer, thermal energy enters an evaporator section of the heat pipe and vaporizes the working fluid. The fluid moves through the heat pipe to an area of lower temperature, then condenses. After the vapor condenses, the wicking structure draws the liquid back to the evaporator section by capillary action within the wick. The cycle is repeated continuously. Because of the rapid transport capability of the vapor, heat pipes have a very high effective thermal conductivity over large distances.

In the heat sink 100, two or four heat pipes extend from the spreader plate, such that heat is quickly transferred from the semiconductor device to the cooling fins 40. In one embodiment, the spreader plate also includes four horizontally placed channels 36 along its base. The channels 36 are grooved structures for receiving the heat pipes. (Another view of the heat pipes and channels can be seen in FIG. 7.) Each heat pipe 30 is disposed in one of the channels 36, causing heat from the semiconductor to conduct to the base of the spreader plate 20, then transfer to the heat pipes 30.

In one embodiment, the heat pipes 30 comprise multiple pieces, some of which fit into the channels 36. The heat pipe arms 34, shown in FIG. 2, fit into the grooved channels, for substantial contact near the heat-producing semiconductor. The heat pipes 30 couple to the heat pipe arms 34, for significant contact with the cooling fins 40.

The heat pipes can be connected to the channels 36 of the spreader plate in a number of ways familiar to those of ordinary skill in the art. Highly thermally conductive epoxy or solder may be used to connect the heat pipes to the channels. Additionally, the heat pipes and/or channels may be braised or crimped if the geometry of the channels is designed for crimping, to guarantee a good mechanical and thermal bond between the spreader plate and the heat pipes. In one embodiment, the channel geometry of the spreader plate allows the heat pipes to simply be press-fit into place upon the spreader plate.

Figure 5:
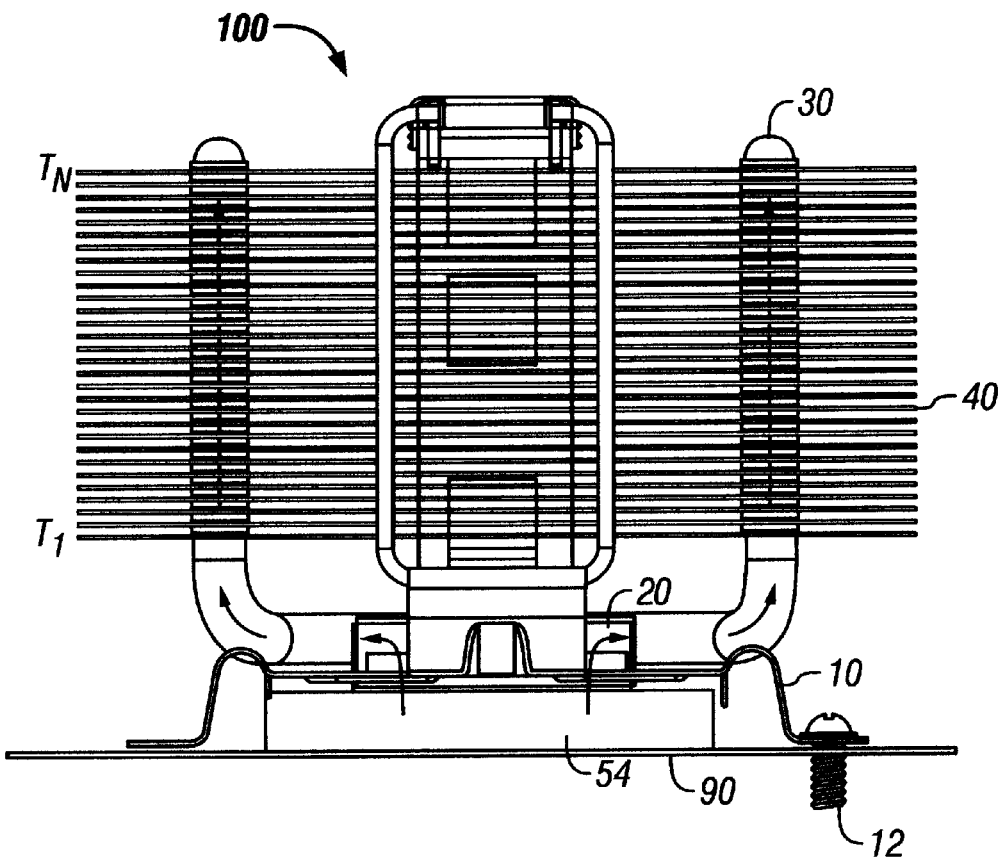
FIG. 5 is a side view of the heat sink of FIG. 1 according to one embodiment of the invention.

In FIG. 5, directional arrows depict the flow of heat from a microprocessor 54 connected to the PCB 90. Because the heat pipes have a low thermal resistance, the heat transfers effectively to the fins. Further, the arrangement of the heat pipes orthogonal to and touching each fin gives good thermal load distribution to the fins. In one embodiment, where $T_1$ is the temperature of a first cooling fin (the cooling fin closest to the spreader plate) and $T_N$ is the temperature of a last cooling fin (the cooling fin farthest from the spreader plate), $T_1$ is approximately equal to $T_N$ during operation of the microprocessor.

Cooling Fins

Cooling fins are featured in many heat sinks. Designed to achieve significant contact with the ambient air, the cooling fins 40 provide a substantial surface area, allowing efficient heat dissipation from the semiconductor. In one embodiment, the cooling fins are made from aluminum material, for a lightweight heat sink assembly, but other materials, such as copper may be substituted. Although illustrated as being substantially planar, the cooling fins may alternatively be bent or otherwise arranged in a different manner than as shown.

The number of fins may vary, depending upon the operating temperature, the weight limitations, the materials used, the type of air-moving device, and the cost. In one embodiment, the number and arrangement of the cooling fins achieve a high aspect ratio, i.e., the ratio of fin height to fin thickness and gap, as compared to many prior heat sinks. The high aspect ratio of the cooling fins typically means better cooling results by the heat sink, provided that a sufficient air flow source is available to overcome the pressure drop expected by high aspect ratio fins.

Referring back to FIG. 2, the cooling fins include cylindrical columns 56, for receiving the heat pipes 30. When engaged into the columns, the heat pipes are in close physical contact with the cooling fins. To achieve this close contact, the heat pipes may be pressure-fitted or the pipes and fins may be made from materials designed for a snug fit. As another option, the heat pipes may be coated with solder or other material and sweated together with the fins during engagement. As a third option, the cooling fins may be bonded to the heat pipes with a conductive epoxy. Preferably, the heat pipes are substantially in contact with the cooling fins on all sides, to ensure efficient heat transfer from pipes to fins.

In one embodiment, the heat pipes are slidably engaged with the cooling fins during installation of the heat pipe assembly. In addition to the simplified installation of the cooling fins, the cooling fins further provide good heat transfer from the heat pipes to the ostensibly cooler ambient air and provide protection from the fan blades.

Active Fan

Embedded within the fins, a fan 50 comprising multiple fan blades 88 provides airflow over the fins during operation. The fan is centrally positioned in an opening 86 within the cooling fins. In one embodiment, the fan is orthogonal to the cooling fins.

By embedding the fan within the center of the heat sink, a maximum airflow and minimal pressure drop is achieved, as compared to fans that are disposed at one end of the fins. The result is that the central placement of the fan 50 achieves more efficient heat transfer.

In contrast to heat sinks where fans are externally exposed, the cooling fins provide a built-in guard for the fan, eliminating the concern that the fan may catch loose wires or even fingers while operating. When installed in place, the fan blades 88 are not exposed above the topmost cooling fin. In one embodiment, the fan is a 60 mm DC fan, powered by a power supply (not shown), and operating at either 5V or 12V.

Figure 6:
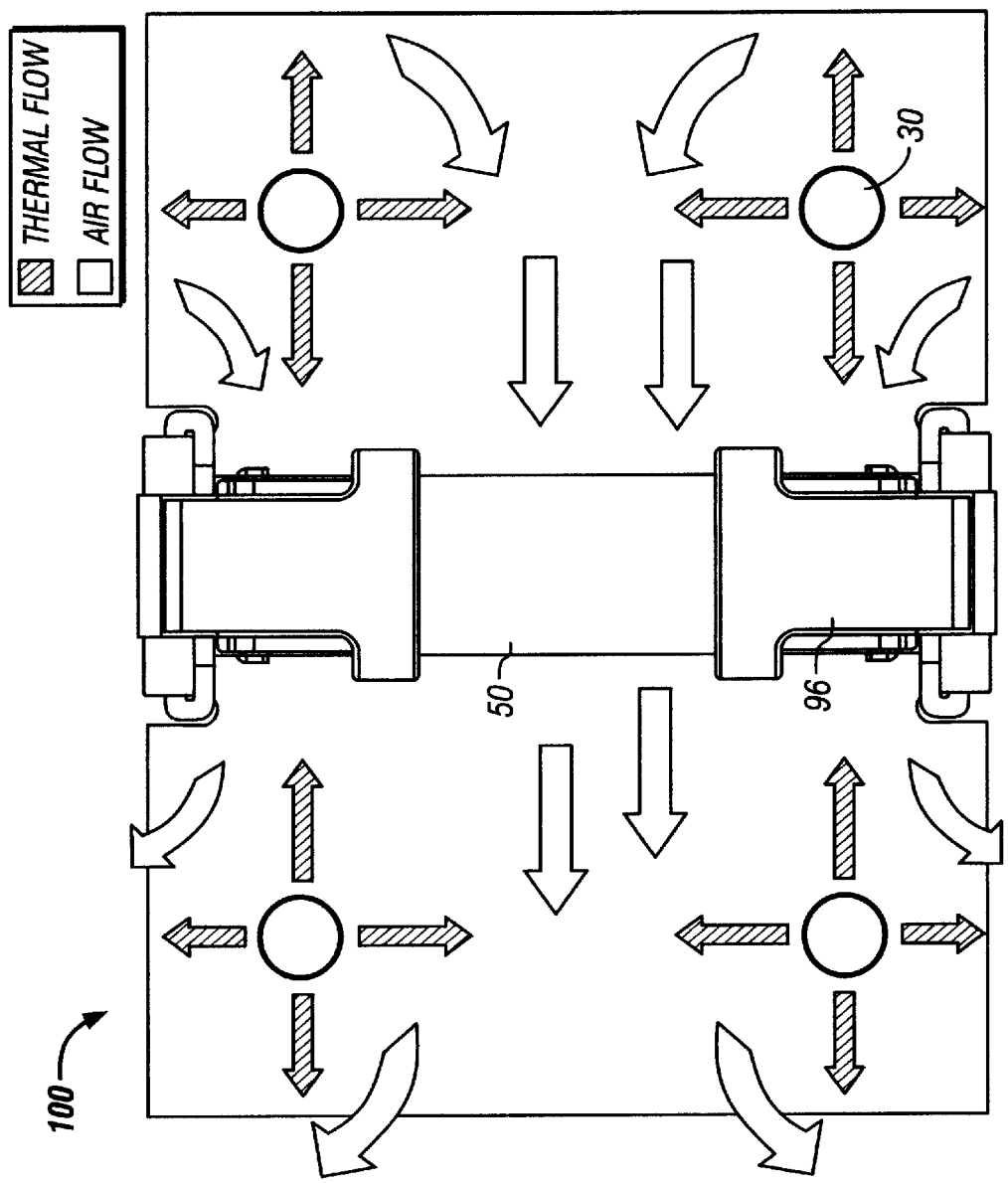
FIG. 6 is a cross-sectional view of the heat sink of FIG. 1 illustrating air and thermal flow according to one embodiment of the invention.

In FIG. 6, a cross-sectional view of the heat sink 100, between two cooling fins, illustrates how the airflow generated by the fan 50 facilitates heat transfer. Thermal flow arrows extend radially from each heat pipe 30, indicating that heat is transferred, equally in all directions, from the heat pipes to each of the cooling fins. This raises the temperature of the cooling fins, which are in contact with the ambient air.

When the fan is turned on, air on one side of the fan flows toward the fan while air on the other side of the fan flows away from the fan. The flow of air blows the heat being transferred from the cooling fins to the ambient air away from the heat sink, lowering the temperature of the cooling fins. The fan thus provides more efficient heat transfer for the heat sink. The placement of the fan within the cooling fins provides an automatic finger guard, as the fan blades do not readily come in contact with loose wires or human fingers.

Latch Assembly

Figure 7:
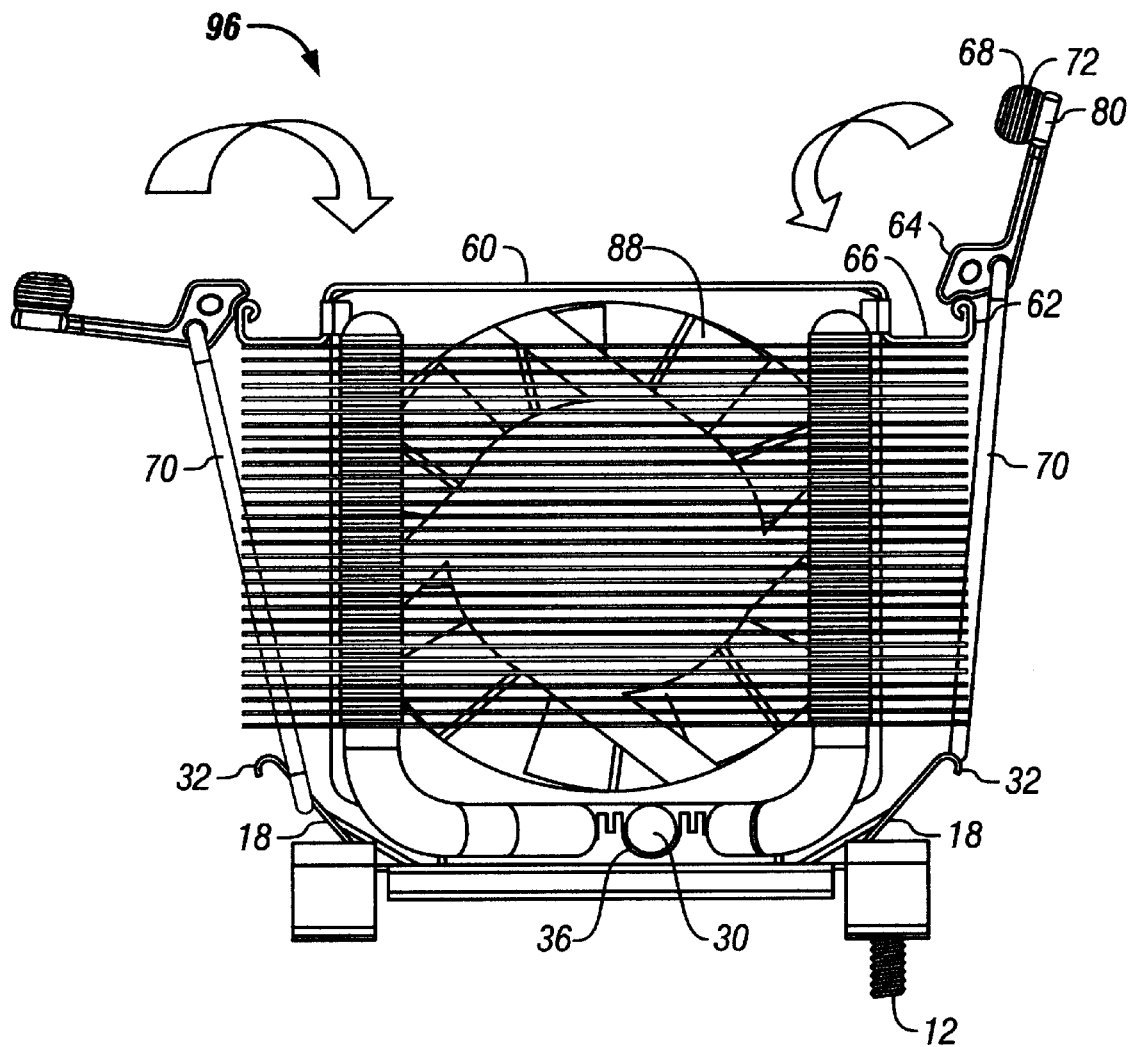
FIG. 7 is a side view of the heat sink of FIG. 1 with unengaged latches according to one embodiment of the invention.

The optional latch assembly 96, illustrated in FIG. 7, secures the removable heat sink components to the PCB. The latch assembly uses an over-center lobe features to provide downward force to the heat sink assembly and to prevent opening of the latches during shock-loading.

A fan cap or plate 60 covers the fan, but also supplies a mechanism for engaging the latch 80 with the top of the heat sink. The latch includes a top portion 68 and a bottom portion 64, the bottom portion being coupled to the wire bail. The fan cap includes a recess 66, into which the bottom portion of the latch rests when the latch assembly is engaged.

The bottom portion 64 is also connected to the wire bail 70. The wire bail is a rigid wire, substantially rectangular in shape, in which two top portions fit securely into each side of the latch 80. A pair of grooved recesses 58 (see FIG. 2), disposed on each side of the cooling fins 40, accepts the wire bail when the latch is engaged. The wire bail binds the heat sink to the base plate and holds the assembly in place when the latch is engaged. The wire bail is virtually unnoticeable when embedded in the grooved recesses, in one embodiment.

The projection 18 is a flexible extension of the base assembly to which the wire bail engages. An end 32 of the projection is curved downward so as to securely grip the wire bail, which is forced upward during engagement of the latch.

The latch assembly provides downward force to the heat sink assembly by hooking the wire bails onto the top of either side of the fan cap. As the latch is rotated toward the center of the assembly, the wire bails of the latch are position in an over-center orientation that keeps the latch engaged even in situations where a load from a shock to the system is applied. Thus, accidental disengagement of the heat sink is prevented.

Specifically, to engage the heat sink to the base assembly, the bottom of the wire bails 70 are secured under the projections 18 of the base plate 10 while the latch 80 is positioned away from the recess, as shown in FIG. 7. The latch 80 is then rotated about an end piece 62 of the fan cap 60 while the bottom of the wire bail moves upward and engages with the end 32 of the projection 18. The rotation of the latch continues until the bottom portion 64 of the latch fits snugly into the recess 66. A top portion 68 of the latch fits over the fan cap and rests thereon. In the engaged position, the wire bails apply tension to the projection, for a tight, substantially immovable fit of the heat sink with the base plate. The base plate, however, has some flexing capability, as described above, to comply with the spring-like, characteristics desirable for components on a printed circuit board.

The top portion of each latch includes serrated sides 72 that rest on either side of the fan cap, just above the topmost cooling fin, when the latch is engaged, in one embodiment. The serrated sides facilitate disengagement of the latch assembly, by allowing a firm grip to be made on the latch mechanism. When the latch is opened, the bottom portion of the latch rotates around the end piece of the fan cap, leaving the recess open, and loosening the wire bail from the base plate projection.

In one embodiment, the components of the heat sink, minus the base plate, may be assembled by hand prior to use.

Furthermore, the components are coupled without use of epoxy, solder, or other connection material, and can be assembled without using tools. The heat pipes can be press-fit into the arms of the spreader plate, then the heat pipes can be inserted through the cooling fins (via the cylindrical columns) for a snug fit with the fins, the fan can be inserted through the cooling fins (via the opening), the fan cap can be inserted upon the top of the fan and, where the latch assembly is used, the wire bails and latch can be inserted upon the fan cap. Once the base plate is in place on the PCB, the latch assembly can engage the heat sink components to the PCB, as described above.

Another desirable feature of the heat sink 100 is its light weight. Each component is designed with weight in mind. In one embodiment, the components of the heat sink are composed of stainless steel, a relatively lightweight material, for a 450 gram or less total weight. Alternatively, the base plate and other components of the heat sink can be made from aluminum, copper, or a composite material, comprising multiple materials such as graphite and cyanate, for example. With the lower mass of the heat sink, additional chassis support is not required.

While the invention has been described with respect to a limited number of embodiments, those skilled in the art will appreciate numerous modifications and variations therefrom. Where reference is made to an embodiment, the embodiment is merely one of multiple embodiments wherein the various embodiments described may be distinct and separate or may be combined. It is intended that the appended claims cover all such embodiments, modifications and variations as fall within the true spirit and scope of the invention.

We claim:

1. A heat sink, comprising:
    a spreader plate for making contact with a heat-producing integrated circuit;
    a plurality of heat pipes thermally coupled to the spreader plate, wherein heat generated by the integrated circuit is conducted to the heat pipes;
    a plurality of cooling fins, comprising columns for receiving and making contact with the plurality of heat pipes, wherein the heat conducted to the heat pipes is further conducted to the plurality of cooling fins; and
    a fan disposed within the plurality of cooling fins, wherein the fan moves ambient air between the plurality of cooling fins and the cooling fins inhibit contact with blades of the fan.

2. The heat sink of claim 1, further comprising:
    a base plate to be fixably coupled to a printed circuit board and to the spreader plate, wherein the base plate does not make contact with the integrated circuit.

3. The heat sink of claim 2, wherein the spreader plate is captivated by the base plate when coupled to the integrated circuit.

4. The heat sink of claim 1, wherein the fan is positioned transverse to the cooling fins.

5. The heat sink of claim 4, wherein the fan blades are guarded by the cooling fins such that the fan blades are not substantially exposed above a topmost cooling fin.

6. The heat sink of claim 1, wherein the heat pipes are positioned transverse to the cooling fins such that the heat pipes are substantially in contact with each cooling fin.

7. The heat sink of claim 1, wherein the spreader plate comprises four heat pipe arms for coupling to two or four heat pipes, wherein the heat pipe arms are disposed in channels of the spreader plate.

8. The heat sink of claim 2, further comprising a latch assembly for coupling the heat sink to the printed circuit board without tools, the latch assembly comprising:
    a fan cap comprising a recess, wherein the fan cap rests upon the fan;
    a latch comprising a portion for fitting into the recess; and
    a wire bail, a first end of which is coupled to the latch, wherein a second end connects beneath a latch projection on the base plate;
wherein the latch assembly, when engaged, secures the fan, cooling fins, heat pipes, and spreader plate to the base plate.

9. The heat sink of claim 8, wherein the cooling fins further comprise grooved recesses into which the wire bail recedes when the latch assembly is engaged.

10. The heat sink of claim 8, wherein the fan, cooling fins, heat pipes, and spreader plate are removable from the base plate when the latch assembly is disengaged.

11. The heat sink of claim 1, wherein the temperature of a first cooling fin closest to the integrated circuit is at a temperature substantially identical to the temperature of a last cooling fin farthest from the integrated circuit.

12. A method of cooling an integrated circuit, comprising:
    tightly coupling a spreader plate to the integrated circuit, the spreader plate comprising a plurality of heat pipes projecting away from the integrated circuit, wherein the heat pipe are pre-filled and sealed with a fluid or gas;
    surrounding the heat pipes with a plurality of cooling fins, each fin transverse to and in fixed contact with each heat pipe, to conduct heat away from the integrated circuit; and
    embedding a fan within the cooling fins, wherein the fan comprises a rotating plurality of blades, wherein the blades cause ambient air to flow across each cooling fin.

13. The method of claim 12, further comprising:
    positioning a base plate on a printed circuit board, wherein the printed circuit board includes the integrated circuit and the base plate surrounds the integrated circuit without making contact thereon.

14. The method of claim 13, positioning the base plate on the printed circuit board further comprising affixing a screw or screw through a leg or legs of the base plate.

15. The method of claim 13, positioning the base plate on the printed circuit board further comprising soldering the base plate to the printed circuit board.

16. The method of claim 13, tightly coupling the spreader plate to the integrated circuit further comprising:
    engaging a wire bail coupled to a top portion of the fan with a projection extending from the base plate; and
    closing a latch connected to the wire bail.

17. The method of claim 13, tightly coupling the spreader plate to the integrated circuit further comprising:
    captivating the spreader plate to the base plate.

18. A heat sink comprising:
    a spreader plate;
    a plurality of heat pipes for coupling to the Treader plate;
    a plurality of cooling fins comprising columns transverse to the fins for receiving and making contact with the plurality of heat pipes; and
    a fan disposed within the plurality of cooling fins, wherein the cooling fins inhibit contact with blades of the fan;
wherein the spreader plate, heat pipes, cooling fins, and fan are press-fit into place without use of tools or connection materials.

19. The heat sink of claim 18, further comprising:

a base plate to be fixably coupled to a printed circuit board and to the spreader plate, wherein the base plate does not make contact with the integrated circuit.

20. The heat sink of claim 19, wherein the base plate is made of stainless steel, the spreader plate and heat pipes are made of copper, and the cooling fins are made of aluminum.

21. The heat sink of claim 19, further comprising:

a latch assembly for coupling the heat sink to the printed circuit board without tools, the latch assembly comprising:

a fan cap comprising a recess, wherein the fan cap rests upon the fan;

a latch comprising a portion for fitting into the recess; and a wire bail, a first end of which is coupled to the latch, wherein a second end connects beneath a latch projection on the base plate;

wherein the latch assembly provides downward force to the heat sink and prevents accidental disengagement of the heat sink from the printed circuit board.

* * * * *